US010325655B2

(12) United States Patent
Ge et al.

(10) Patent No.: US 10,325,655 B2
(45) Date of Patent: Jun. 18, 2019

(54) TEMPERATURE COMPENSATION CIRCUITS

(71) Applicant: Hewlett Packard Enterprise Development LP, Houston, TX (US)

(72) Inventors: Ning Ge, Palo Alto, CA (US); Jianhua Yang, Palo Alto, CA (US); Miao Hu, Palo Alto, CA (US); John Paul Strachan, San Carlos, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/556,361

(22) PCT Filed: Apr. 10, 2015

(86) PCT No.: PCT/US2015/025450
§ 371 (c)(1),
(2) Date: Sep. 7, 2017

(87) PCT Pub. No.: WO2016/164049
PCT Pub. Date: Oct. 13, 2016

(65) Prior Publication Data
US 2018/0108403 A1 Apr. 19, 2018

(51) Int. Cl.
*G11C 7/04* (2006.01)
*G11C 13/00* (2006.01)

(52) U.S. Cl.
CPC .............. *G11C 13/004* (2013.01); *G11C 7/04* (2013.01); *G11C 13/0007* (2013.01); *G11C 13/0033* (2013.01); *G11C 13/0038* (2013.01); *G11C 13/0069* (2013.01)

(58) Field of Classification Search
CPC .............. G11C 13/004; G11C 13/0007; G11C 13/0033; G11C 13/0038; G11C 13/0069; G11C 7/04
See application file for complete search history.

(56) References Cited

U.S. PATENT DOCUMENTS

| 5,956,289 | A * | 9/1999 | Norman | G11C 7/22 365/164 |
|---|---|---|---|---|
| 7,630,266 | B2 | 12/2009 | Incarnati et al. | |
| 8,419,273 | B2 | 4/2013 | Hadwen et al. | |

(Continued)

OTHER PUBLICATIONS

Fan, D., et al., Design and Synthesis of Ultra Low Energy Spin-Memristor Threshold Logic [online], Jan. 30, 2014, Retrieved from the Internet: <http://arxiv.org/ftp/arxiv/papers/1402/1402.2648. pdf> [retrieved on Jan. 29, 2015], 10 pages.

(Continued)

*Primary Examiner* — Sung Il Cho
(74) *Attorney, Agent, or Firm* — Hewlett Packard Enterprise Patent Department

(57) ABSTRACT

A temperature compensation circuit may comprise a temperature sensor to sense a temperature signal of a memristor crossbar array, a signal converter to convert the temperature signal to an electrical control signal, and a voltage compensation circuit to determine a compensation voltage based on the electrical control signal and pre-calibrated temperature data of the memristor crossbar array.

14 Claims, 3 Drawing Sheets

(56) References Cited

U.S. PATENT DOCUMENTS

| | | | |
|---|---|---|---|
| 8,872,246 B1 | 10/2014 | Stevens et al. | |
| 9,117,749 B1* | 8/2015 | Or-Bach | H01L 27/2436 |
| 9,165,647 B1* | 10/2015 | Guliani | G11C 11/1657 |
| 2004/0151023 A1* | 8/2004 | Khouri | G11C 7/04 |
| | | | 365/163 |
| 2005/0127403 A1* | 6/2005 | Hsu | G11C 7/04 |
| | | | 257/200 |
| 2011/0080775 A1* | 4/2011 | Bae | G11C 7/04 |
| | | | 365/163 |
| 2012/0129301 A1* | 5/2012 | Or-Bach | H01L 21/6835 |
| | | | 438/129 |
| 2013/0003438 A1* | 1/2013 | Merkel | G11C 7/04 |
| | | | 365/148 |
| 2013/0028004 A1 | 1/2013 | Snider | |
| 2014/0027705 A1 | 1/2014 | Yang et al. | |
| 2014/0029328 A1* | 1/2014 | Ribeiro | G11C 13/0069 |
| | | | 365/148 |
| 2014/0133211 A1 | 5/2014 | Nazarian et al. | |
| 2014/0136755 A1* | 5/2014 | Hyde | G06F 15/7814 |
| | | | 711/103 |
| 2014/0167999 A1 | 6/2014 | Moore | |
| 2015/0043266 A1* | 2/2015 | Youn | G11C 13/0021 |
| | | | 365/148 |
| 2015/0092470 A1 | 4/2015 | Vimercati et al. | |
| 2015/0200363 A1* | 7/2015 | Sacchetto | G11C 13/0007 |
| | | | 365/148 |
| 2015/0279472 A1* | 10/2015 | Jones | G11C 16/24 |
| | | | 365/185.19 |
| 2016/0284386 A1* | 9/2016 | McCall | G11C 7/1057 |

OTHER PUBLICATIONS

International Searching Authority, The International Search Report and the Written Opinion, dated Jan. 8, 2016, 11 Pages.

Manem, H., et al., Design Considerations for Multilevel CMOS/Nano Memristive Memory, ACM Journal on Emerging Technologies in Computing Systems, Feb. 2012, vol. 8, Issue 1, Article No. 6, 22 pages.

Sharad, M., et al., Ultra-low Energy, High-Performance Dynamic Resistive Threshold Logic [online], Aug. 6, 2013, Retrieved from the Internet: <http://www.seas.ucla.edu/~dorrance/cite/Ultra-low%20Energy,%20High-Performance%20Dynamic%20Resistive%20Threshold%20Logic.pdf> [retrieved on Jan. 29, 2015], 3 pages.

* cited by examiner

TEMPERATURE COMPENSATION CIRCUITS

STATEMENT OF GOVERNMENT RIGHTS

This invention was made with Government support. The Government has certain rights in the invention.

BACKGROUND

Memristors are devices that can be programmed to different resistive states by applying a programming energy, such as a voltage. Large crossbar arrays of memory devices can be used in a variety of applications, including random access memory, non-volatile solid state memory, programmable logic, signal processing control systems, pattern recognition, and other applications. The electrical properties of memristors may be affected by the temperature of the memristors or its surrounding circuitry.

BRIEF DESCRIPTION OF THE DRAWINGS

The following detailed description references the drawings, wherein.

DETAILED DESCRIPTION

Memristors are devices that may be used as components in a wide range of electronic circuits, such as memories, switches, radio frequency circuits, and logic circuits and systems. A memristor crossbar array can be used to perform vector-matrix or dot product computations. For example, an input voltage signal from each row of the crossbar is weighted by the conductance of the resistive devices in each column and accumulated as the current output from each column. Ideally, if wire resistances can be ignored, the current vector, I, flowing out of the crossbar array will be approximately $I^T = V^T G$, where V is the input voltage vector and G is the conductance matrix, including contributions from each memristor in the crossbar array. The need for fast and efficient vector-matrix processing techniques arises in many computing applications. For example, vector-matrix operations are utilized in data-compression, digital data processing, neural networks, encryption, and optimization, to name a few.

The use of memristors at each junction or cross-point of the crossbar array enables programming the resistance (or conductance) at each such junction corresponding to the values of G, leading to use of the crossbar array as a dot product engine (DPE). Accuracy is important in the design and application of dot product engines. However, many memristors exhibit electrical properties that are temperature-dependent. For example, the resistance of a memristor may depend on the temperature of the memristor. Because temperature fluctuations are common in circuit operations, using a memristor crossbar array as a DPE may present challenges in ensuring accurate calculations. For example, stabilizing the temperature of crossbar arrays may be practically difficult.

Examples disclosed herein provide for temperature compensation circuits to account for temperature fluctuations in a memristor crossbar array. In example implementations, temperature compensation circuits may include a temperature sensor to sense a temperature of the memristor crossbar array. Example temperature compensation circuits may have a signal converter to convert the temperature to an electrical control signal. The electrical control signal may direct a voltage compensation circuit to determine a compensation voltage based on pre-calibrated temperature data of the memristor crossbar array. In this manner, examples herein provide for temperature compensation of a memristor crossbar array. By accounting for temperature effects, memristor crossbar arrays can be used as accurate dot product engines.

Figure 1:
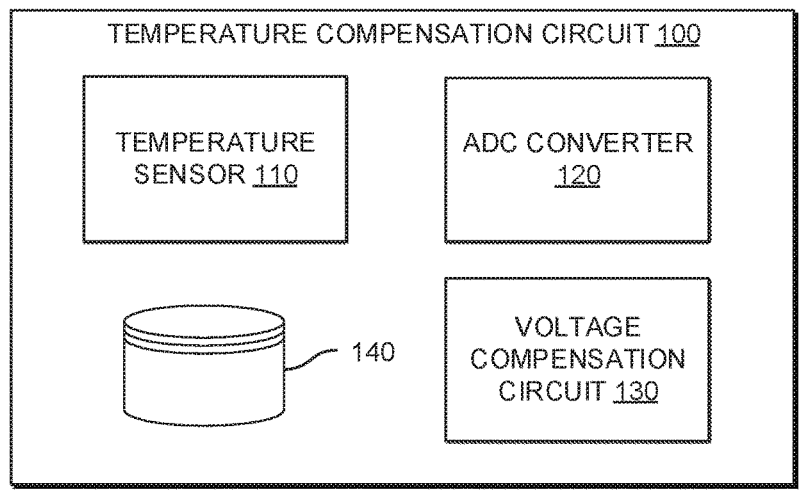
FIG. 1 is a block diagram of an example temperature compensation circuit.

Referring now to the drawings, FIG. 1 is a block diagram of an example temperature compensation circuit 100. Temperature compensation circuit 100 may determine a compensation voltage that may be applied to a memristor crossbar array in order to neutralize or account for temperature effects on the resistance of the memristors of the array. Temperature compensation circuit 100 may have a temperature sensor 110, a signal converter which is illustrated in FIG. 1 as an analog-to-digital (ADC) converter 120, a voltage compensation circuit 130, and a storage 140.

Temperature sensor 110 may sense a temperature of a memristor crossbar array. Temperature sensor 110 may be a device, circuit, or component that is capable of sensing the temperature of an object. Specifically, temperature sensor 110 may sense the temperature of the memristor crossbar array to detect the temperature effect on the memristors. Examples for temperature sensor 110 may include thermistors, diode sensors, temperature coefficient sensors, and bandgap circuit sensors. Other examples include mechanical sensors such as thermometers and bimetal sensors. In some examples, temperature sensor 110 may include memristors.

A memristor crossbar array may be a configuration of sets of parallel crossing lines with memristors and/or other components coupled between intersections of lines. For example, a memristor array may have a first plurality of parallel lines referred to as row lines intersecting another plurality of parallel lines referred to as column lines, where memristors serve as cross-points of the lines. Each memristor of a memristor array may be coupled between a unique combination of a row line and a column line. In other words, no memristors share both a row line and a column line. As used herein, components may be coupled by forming an electrical connection between the components. For example, memristors may be coupled to lines by forming a direct, surface contact or by other forms of physical connection. Additional discussion of memristors and crossbar arrays are provided herein in relation to FIG. 2.

ADC converter 120 may be a device that converts a continuous physical quantity to a digital number that represents the quantity. Specifically, ADC converter 120 may convert the temperature sensed by the temperature sensor 110 to a digital control signal. For example, ADC converter 120 may take a continuous-time and continuous-amplitude analog temperature signal and convert it to a sequence of digital values that represent a discrete-time and discrete-amplitude digital signal. The digital control signal may communicate the temperature sensed by temperature sensor 110 to voltage compensation circuit 130. It should be noted that while 120 illustrates an ADC converter, other types of signal converters may be used according to the teachings herein.

Voltage compensation circuit 130 may determine a compensation voltage based on the digital control signal provided by ADC converter 120 and pre-calibrated temperature data of the memristor crossbar array, which may be stored in and accessed from storage 140. The digital control signal may tell voltage compensation circuit 130 the temperature of the memristors in the array. The pre-calibrated temperature data can be accessed and compared to determine the amplitude of the compensation voltage.

In some implementations, the pre-calibrated temperature data of the memristor crossbar array may include temperature-dependent resistance of the memristors. As described previously, the resistance of the memristors may change depending on the temperature of the memristors. This data may be stored in storage 140 and accessed by voltage compensation circuit 130 in determining the compensation voltage. For example, voltage compensation circuit 130 may determine the compensation voltage by matching the temperature of the memristor crossbar array with the pre-calibrated data.

Storage 140 may store the pre-calibrated temperature data of the memristor crossbar array. Storage 140 may be any electronic, magnetic, optical, or other physical storage device. Thus, storage 140 may be for example, a Random Access Memory (RAM), an Electrically Erasable Programmable Read-Only Memory (EEPROM), a storage device, an optical disc, and the like. Storage 140 may be a non-transitory storage medium, where the term "non-transitory" does not encompass transitory propagating signals. Storage 140 may be located in temperature compensation circuit 100, in another device in communication with temperature compensation circuit 100, or it may be, for example, cloud-hosted storage.

Figure 2:
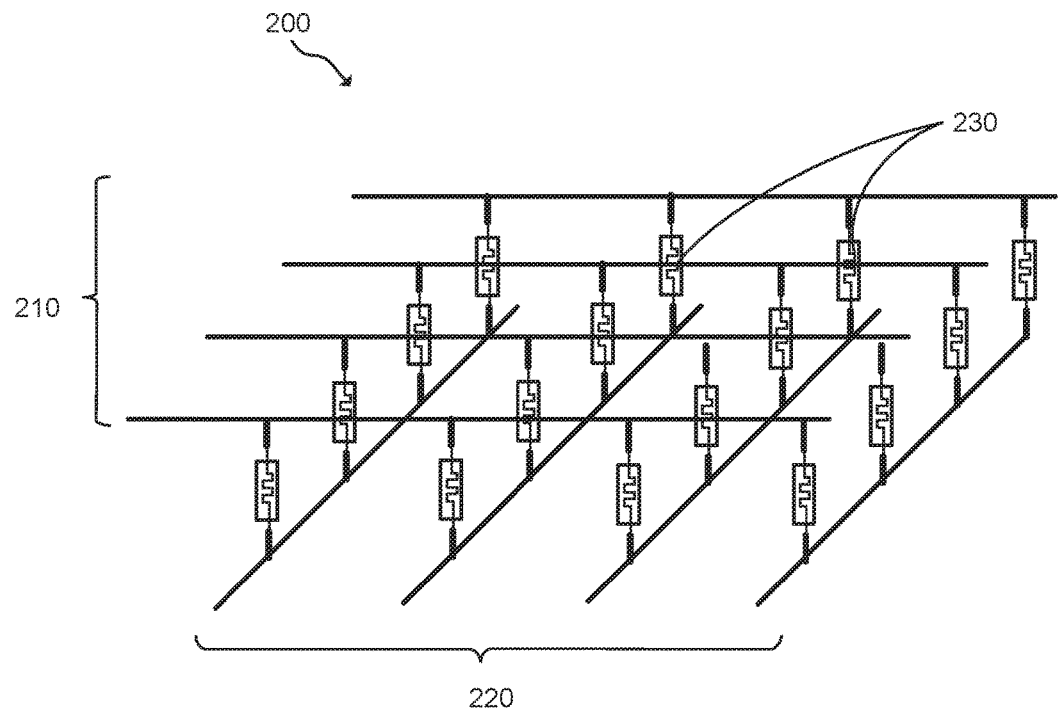
FIG. 2 is a diagram of an example crossbar array.

FIG. 2 is a diagram of an example memristor crossbar array 200, such as an example crossbar array operable connected to temperature compensation circuit 100. Memristor array 200 may be a configuration of parallel and perpendicular lines with memristors and other components coupled between lines at cross-points. Memristor array 200 may include a plurality of row lines 210, a plurality of column lines 220, and a plurality of memristors 230. Each memristor may be coupled between a unique combination of one row line and one column line. In other words, no memristors share both a row line and a column line. Memristor array 200 may be used in a variety of applications, including as a dot product engine as described herein.

Row lines 210 may be electrodes that carry current through memristor array 200. In some examples, row lines 210 may be in parallel to each other, generally with equal spacing. Row lines 210 may sometimes be referred to as bit lines. Depending on orientation, row lines 210 may alternatively be referred to as word lines. Similarly, column lines 220 may be electrodes that run nonparallel to row lines 210. Column lines 220 may be referred to as word lines in some conventions. In other orientations, column lines 220 may refer to bit lines. Row lines 210 and column lines 220 may be made of conducting materials, such as platinum (Pt), tantalum (Ta), hafnium (Hf), zirconium (Zr), aluminum (Al), cobalt (Co), nickel (Ni), iron (Fe), niobium (Nb), molybdenum (Mo), tungsten (W), copper (Cu), titanium (Ti), tantalum nitrides ($TaN_x$), titanium nitrides ($TiN_x$), $WN_2$, NbN, MoN, $TiSi_2$, TiSi, $Ti_5Si_3$, $TaSi_2$, $WSi_2$, $NbSi_2$, $V_3Si$, electrically doped Si polycrystalline, electrically doped Ge polycrystalline, and combinations thereof. Row lines 210 and column lines 220 may serve as electrodes that deliver voltage and current to the memristors 230.

Memristors 230 may be coupled between row lines 210 and column lines 220. In some implementations, a memristor 230 may have a resistance that changes with an applied voltage or current. Furthermore, memristor 230 may "memorize" its last resistance. In this manner, each memristor 230 may be set to at least two states. Furthermore in some examples, other components may be coupled with memristors 230. For example, each memristor may be coupled in series with a transistor and/or a selector.

In some examples, the resistance of the memristors 230 may be dependent on its temperature. For example, the resistance of a memristor 230 may decrease with increasing temperature. Accordingly, the current through each memristor 230 may depend on its temperature in addition to an applied voltage.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such silicon oxynitride. In addition, other functioning memristors may be employed in the practice of the teachings herein.

Memristors 230 may exhibit nonlinear or linear current-voltage behavior. Nonlinear may describe a function that grows differently than a linear function. For example, this may mean that current flowing through memristor 230 increases faster than linear growth with relation to applied voltage. Linear materials may follow Ohm's law, where the current through them is proportional to the voltage. On the other hand, the current flowing through a nonlinear material may disproportionately increase as the voltage is increased. In some implementations, such as a typical DPE application, the memristors 230 may be linear.

Figure 3:
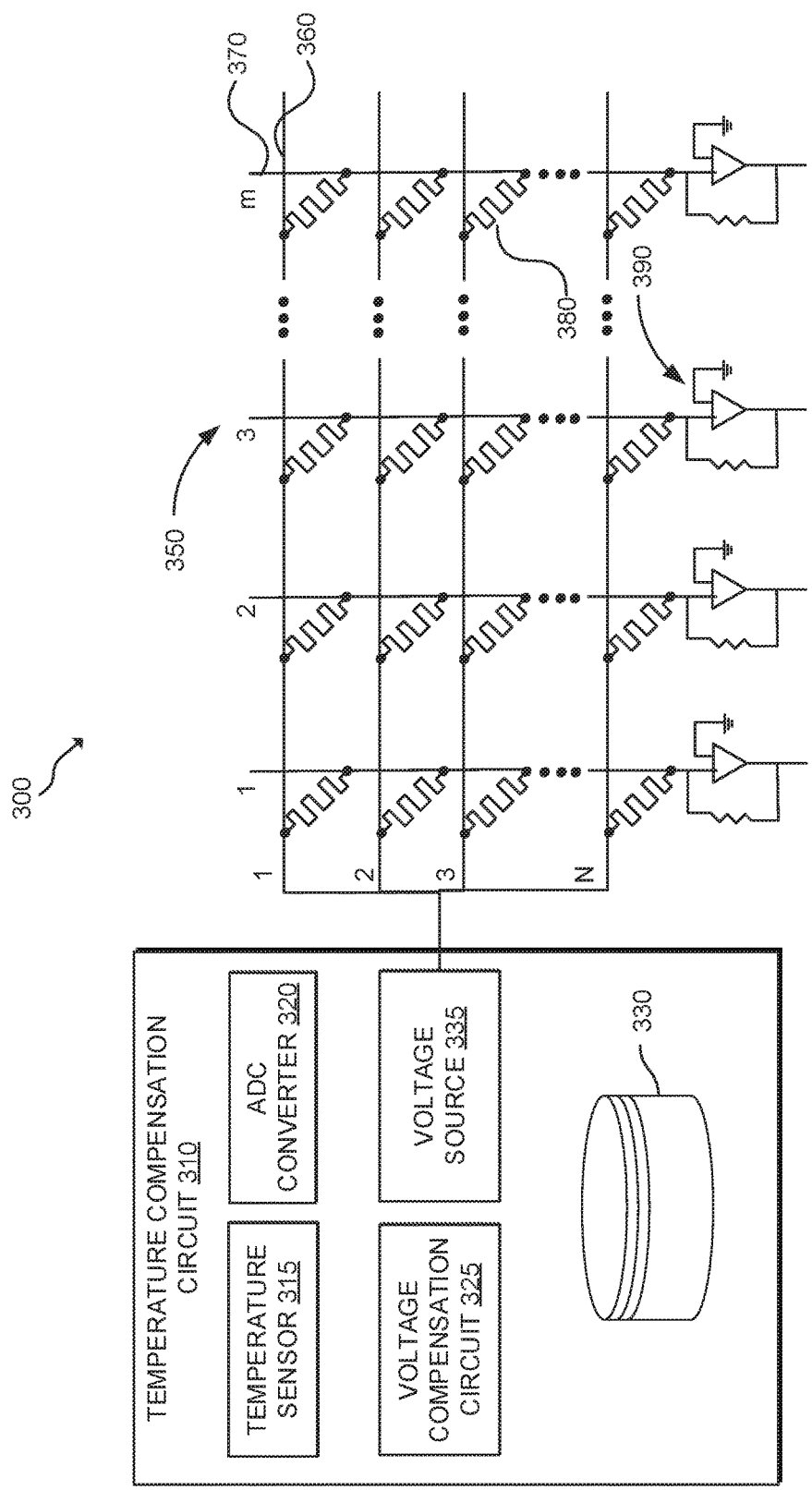
FIG. 3 is a diagram of an example crossbar array with a temperature compensation circuit.

FIG. 3 is a diagram of an example memory circuit 300 with a crossbar array 350 and a temperature compensation circuit 310. Temperature compensation circuit 310 may be analogous to temperature compensation circuit 100 of FIG. 1, and crossbar array 350 may be analogous to crossbar array 200 of FIG. 2. System 300 may be utilized as a dot product engine. In some examples, system 300 may be a part of a larger system, such as a computing device. For example, system 300 may be components on a computing chip. In some examples, memory circuit 300 may be used as a memristive dot product engine.

Temperature compensation circuit 310 may include a temperature sensor 315 analogous to temperature sensor 110, an ADC converter 320 analogous to ADC converter 120, voltage compensation circuit 325 analogous to voltage compensation circuit 130, and storage 330 analogous to storage 140. Temperature sensor 110 may sense a temperature of crossbar array 350. ADC converter 320 may convert the temperature to a digital control signal. Voltage compensation circuit 325 may determine a compensation voltage based on the digital control signal and on temperature-dependent resistance of memory elements 380 of crossbar array 350. The temperature-dependent resistance of memory elements 380 may be stored in and accessed from storage 330.

Additionally, temperature compensation circuit 310 may include at least one voltage source 335 to apply the compensation voltage to crossbar array 350. The compensation voltage may compensate for a difference in resistance of the memory cells as a result of the temperature of the crossbar array 350. Voltage source 335 may be coupled to the crossbar array 350 so that all of the memory cells 380 may be accessed by the compensation voltage. For example, voltage source 335 may be coupled to all of the plurality of row lines 360 or all of the plurality of column lines 370 or both. As shown in FIG. 3, voltage source 335 is connected to the row lines 360 of crossbar array 350.

In some examples, temperature compensation circuit 310 may include one voltage source 335 that provides the compensation voltage to all of the lines or multiple lines of crossbar array 350. Alternatively, temperature compensation circuit 310 may include multiple voltage sources 335. For example, each line may be connected to a different voltage source 335.

In some implementations, temperature sensor 315 may sense the temperature of individual memory cells 380 or groups of memory cells. In such cases, the compensation voltage to be applied by each voltage source 335 may be different due to different memory cells having different temperatures, which may result in the memory cells exhibiting different resistances.

In some examples, the compensation voltage is added to an input voltage which is applied during the DPE operation in order to obtain a compensated voltage. The compensated voltage may cause an amount of current to pass through memristors 380 that may be equivalent to the current that would pass through the memristor when the input voltage is applied while the memristor is at a neutral temperature. The neutral temperature may be the temperature at which the resistance of the memristor is calibrated.

Crossbar array 350 may include a plurality of row lines 360, a plurality of column lines 370, a plurality of memory cells 380, and a plurality of sensing circuits 390. Crossbar array 350 may be connected to temperature compensation circuit 310, which may provide a compensation voltage that may compensate for temperature effects on the crossbar array.

As illustrated in FIG. 3, voltages may be applied to row lines 360, which causes a current to be driven through memory cells 380. In some examples, sensing circuits 390 may convert an electrical current, such as that passing through the memory cells, in a column line 370 to a voltage. In an example of the principles described herein, the sensing circuits 390 include an operational amplifier and a resistor, which can be arranged to represent a virtual ground for read operations.

Although not illustrated n FIG. 3, crossbar array 350 may also include other peripheral circuitry. For example, crossbar array 350 may include drivers connected to the row lines 360. An address decoder can be used to select a row line 360 and activate a driver corresponding to the selected row line 360. The driver for a selected row line 360 can drive a corresponding row line 360 with different voltages corresponding to a vector-matrix multiplication or the process of setting resistance values within the memory cells 380 of the crossbar array 350. In some examples, the drivers may be the voltage sources 335 of the temperature compensation circuit 310. Similar driver and decoder circuitry may be included for the column lines 370.

Control circuitry may also be used to control application of voltages at the inputs and reading of voltages at the outputs of the crossbar array 350. Digital to analog circuitry and analog to digital circuitry may be used in some examples in the control circuitry. The peripheral circuitry above described can be fabricated using semiconductor processing techniques in the same integrated structure or semiconductor die as crossbar array 350.

As described in further detail below, there are two main operations that occur during operation of a dot-product engine. The first operation is to program memristors in a crossbar array so as to map the mathematic values in an N×M matrix to the array. In one example, only one memristor is programmed at a time during the programming operation. The second operation is the dot-product or matrix multiplication operation. In this operation, input voltages are applied and output voltages obtained, corresponding to the result of multiplying an N×M matrix by an N×1 vector. Generally, the input voltages are below the threshold of programming voltages of the memristors so the resistance values of the memristors in the array are not changed during the matrix multiplication operation.

In one example of dot-product engine operation according to the principles described herein, vector and matrix multiplications may be executed through memory circuit 300 by applying a set of voltages simultaneously along the row lines 360 of the N×M crossbar array 350 and collecting the currents through the column lines 370 and measuring the output voltage. On each column, every input voltage is weighted by a corresponding memristance (1/Gij) and the weighted summation is reflected at the output voltage. Using Ohm's law, the relation between the input voltages and output voltages can be represented by a vector matrix multiplication of the form: $\{VO\}T=-\{VI\}T[G]RS$, where Gij is an N×M matrix determined by the conductance (inverse of resistance) of the crossbar array 350, RS is the resistance value of the sense amplifiers and T denotes the transpose of the column vectors VO and VI. The negative sign follows from use of a negative feedback operational amplifier in the sense amplifiers. From the foregoing, it follows that the dot-product engine can be utilized for vector processing and, more specifically, for multiplying a first vector of values $\{bi\}T$ by a matrix of values $[aij]$ to obtain a second vector of values $\{cj\}T$, where i=1,N and j=1, M. The vector operation can be set forth in more detail as follows.

$$a11b1+a21b2+\ldots+aN1bN=c1$$

$$\ldots$$

$$a1Mb1+a2Mb2+\ldots+aNMbN=cM.$$

The vector processing or multiplication using the principles described herein generally starts by mapping a matrix of values [aij] onto the crossbar array 350 or, stated otherwise, programming—e.g., writing—conductance values Gij into the crossbar junctions of array 350. In one example, each of the conductance values Gij is set by sequentially imposing a voltage drop over each of the crossbar junctions. For example, the conductance value G2,3 may be set by applying a voltage equal to VRow2 at the 2nd row line 360 of the crossbar array 350 and a voltage equal to VCol3 at the 3rd column line of the array. In one example, the voltage input, VRow2, will be applied to the 2nd row line adjacent the j=1 column electrode. The voltage input, VCol3, will be applied to the 3rd column line adjacent either the i=1 or i=N location. When applying a voltage at a column line, the sensing circuit 390 for that line may be switched out and a voltage driver switched in. The voltage difference VRow2–VCol3 will generally determine the resulting conductance value G2,3 based on the characteristics of the memory cell 380 located at the intersection. When following this approach, the unselected column lines and row lines may be addressed according to one of several schemes, including, for example, floating all unselected columns and rows or grounding all unselected columns and rows. Other schemes involve grounding columns or grounding partial columns. Grounding all unselected columns and rows is beneficial in that the scheme helps to isolate the unselected columns and rows to minimize the sneak path currents to the selected output column. Following programming, operation of the dot-product engine proceeds by applying the vector of input voltages and reading the vector of output voltages.

In accordance with an example of the principles disclosed herein, the memory cells 380 used for the dot product engine may have a linear current-voltage relation. For example memory cell 380 may have a linear memristor. Linear current-voltage relations permit higher accuracy in the vector multiplication process. However, crossbar arrays 350 having linear memristors are prone to having large sneak path currents during programming of the array, particularly when the size of the crossbar array 350 is larger than a certain size, for instance, 32×32. In such cases, the current running through a selected memory cell 380 may not be sufficient to program the memory cell because most of the current runs through the sneak paths.

Alternatively, a memory cell 380 may be programmed at an inaccurate value because of the sneak paths. To alleviate the sneak path currents in such instances, and especially when larger arrays are desired, an access device, such as a non-linear selector or transistor (e.g., a normally ON depletion mode transistor) may be incorporated within or utilized in the memory cell 380 to minimize the sneak path currents in the array. More specifically, memory cell 380 should be broadly interpreted to include memristive devices including, for example, a memristor, a memristor and selector, or a memristor and transistor.

Figure 4:
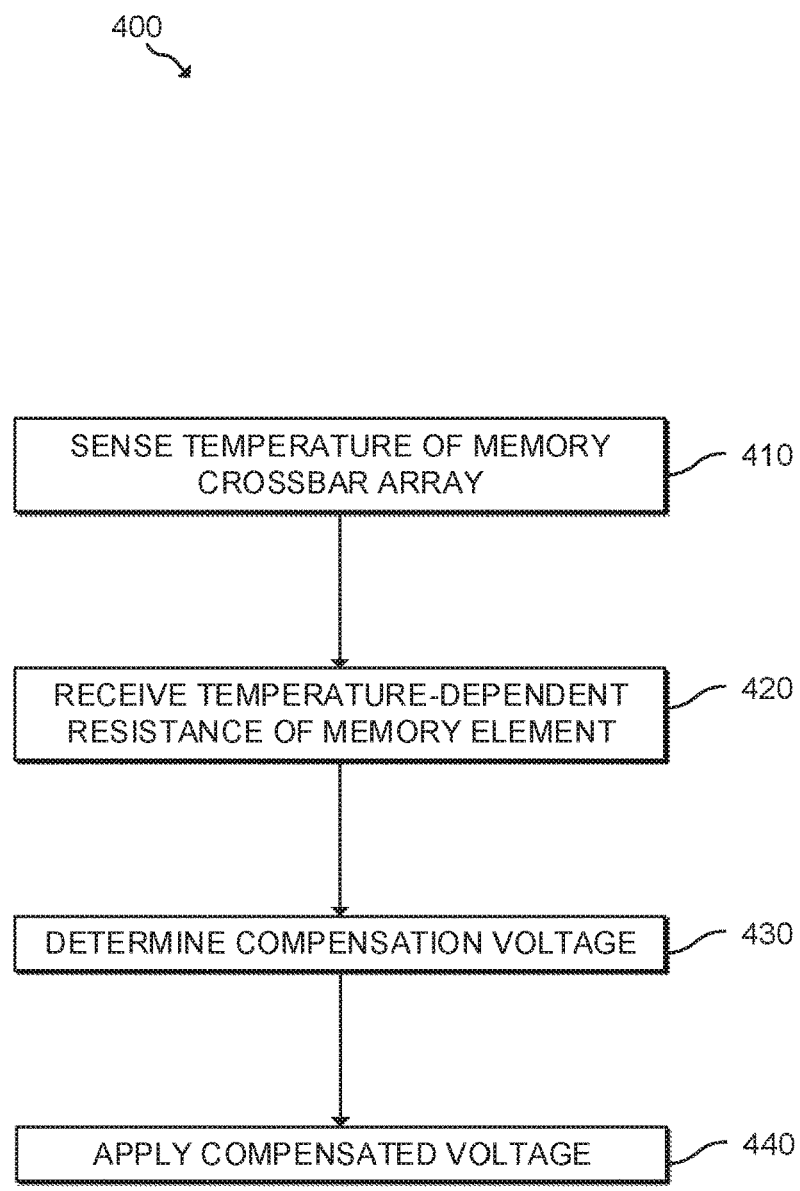
FIG. 4 is a flowchart of an example method for applying a compensated voltage.

FIG. 4 depicts an example method 400 for applying a compensated voltage.

Although execution of method 400 is described below with reference to memory circuit 300 of FIG. 3, other suitable components for execution of method 400 should be apparent, including voltage compensation circuit 100 of FIG. 1.

In an operation 410, temperature sensor 315 may sense a temperature of memory crossbar array 350. In some implementations, temperature sensor 315 may sense the temperature of individual memory elements 380 or groups of memory elements. In some examples, the temperature of the memory cell may be communicated to ADC converter 320, which may convert the temperature data to a digital control signal.

In an operation 420, voltage compensation circuit 325 may receive a temperature-dependent resistance of memory elements 380 of crossbar array 350. Temperature-dependent resistance of the memory elements may be pre-calibrated and may be stored in storage 330 to be accessed.

In an operation 430, voltage compensation circuit 325 may determine a compensation voltage based on the temperature of crossbar array 350 and on the temperature-dependent resistance of memory elements 380. For example, voltage compensation circuit 325 may receive the digital control signal from ADC converter 320. The digital control signal may communicate the temperature levels of crossbar array 350 and/or the individual memory elements 380. Voltage compensation circuit 325 may match digital control signal with the pre-calibrated resistance data to determine the compensation voltage.

In an operation 440, voltage source 335 may apply a compensated voltage, which includes the compensation voltage and an input voltage. The input voltage may be a default voltage that produces a certain amount of current through a memory element 380 at a neutral or calibration temperature. Therefore, the compensated voltage provides the input voltage adjusted by the compensation voltage in order to account for temperature differences in the crossbar array 350.

The foregoing describes a number of examples for voltage compensation circuits. It should be understood that the voltage compensation circuits and applications described herein may include additional components or steps and that some of the components or steps described herein may be removed or modified without departing from the scope of the voltage compensation circuits. It should also be understood that the components depicted in the figures are not drawn to scale, and thus, the components may have different relative sizes with respect to each other than as shown in the figures.

It should be noted that, as used in this application and the appended claims, the singular forms "a," "an," and "the" include plural elements unless the context clearly dictates otherwise.

What is claimed is:

1. A temperature compensation circuit, comprising:
   a temperature sensor to sense a temperature signal of a memristor crossbar array;
   a signal converter to convert the temperature signal to an electrical control signal; and
   a voltage compensation circuit to determine a compensation voltage based on the electrical control signal and pre-calibrated temperature data of the memristor crossbar array, wherein the compensation voltage is determined by comparing a temperature of the memristor crossbar array with the pre-calibrated temperature data of the memristor crossbar array, wherein the pre-calibrated temperature data of the memristor crossbar array comprises a temperature-dependent resistance of the memristors.

2. The temperature compensation circuit of claim 1, further comprising a voltage source to apply the compensation voltage to the memristor crossbar array.

3. The temperature compensation circuit of claim 1, wherein the compensation voltage is to compensate for a difference in resistance of the memristors as a result of the temperature of the memristor crossbar array.

4. The temperature compensation circuit of claim 1, wherein the memristor crossbar array comprises:
   a plurality of row lines;
   a plurality of column lines;
   a plurality of memristors coupled between a unique combination of one row line and one column line.

5. The temperature compensation circuit of claim 4, wherein each of the memristors exhibits linear current-voltage behavior.

6. The temperature compensation circuit of claim 4, wherein the signal converter is an analog-to-digital converter.

7. The temperature compensation circuit of claim 1, wherein the temperature sensor comprises any of a diode sensor, a temperature coefficient sensor, a band gap circuit sensor, and a memristor-based sensor.

8. A memory circuit, comprising:
a memory crossbar array comprising a plurality of row lines, a plurality of column lines, and a plurality of memory elements, wherein each memory element is coupled between a unique combination of one row line and one column line; and
a temperature compensation circuit, comprising:
a temperature sensor to sense a temperature signal of the memory crossbar array;
a signal converter to convert the temperature to an electrical control signal;
a voltage compensation circuit to determine a compensation voltage based on the electrical control signal and on a temperature-dependent resistance of the memory elements, wherein the compensation voltage is to compensate for a difference in resistance of the memory cells as a result of the temperature of the memory crossbar array, wherein the compensation voltage is determined by comparing the temperature of the memory crossbar array with a pre-calibrated temperature data of the memory crossbar array, wherein the pre-calibrated temperature data of the memory crossbar array comprises the temperature-dependent resistance of the memory elements; and
a voltage source to apply the compensation voltage to the memory crossbar array.

9. The memory circuit of claim 8, wherein each of the memory elements exhibits linear current-voltage behavior.

10. The memory circuit of claim 8, further comprising a storage for storing the temperature-dependent resistance data of the memory elements.

11. The memory circuit of claim 8, wherein each of the memory elements comprises a memristor.

12. A method, comprising:
sensing a temperature of a memory crossbar array, wherein the memory crossbar array comprises a plurality of memory elements;
receiving a temperature-dependent resistance of the memory elements;
determining a compensation voltage based on the temperature of the memory crossbar array and on the temperature-dependent resistance of the memory elements, wherein the compensation voltage is determined by comparing the temperature of the memory crossbar array with a pre-calibrated temperature data of the memory crossbar array, wherein the pre-calibrated temperature data of the memory crossbar array comprises the temperature-dependent resistance of the memory elements; and
applying a compensated voltage, wherein the compensated voltage comprises the compensation voltage and an input voltage.

13. The method of claim 12, wherein applying the compensation voltage is to compensate for a difference in resistance of the memory elements as a result of the temperature of the memory crossbar array.

14. The method of claim 12, wherein the memory crossbar array comprises a plurality of row lines and a plurality of column lines, and wherein each memory element comprises a memristor coupled between a unique combination of one row line and one column line.

* * * * *